(12) United States Patent
Jang

(10) Patent No.: US 11,557,640 B2
(45) Date of Patent: Jan. 17, 2023

(54) CIRCUIT BOARD AND DISPLAY DEVICE INCLUDING THE SAME

(71) Applicant: Samsung Display Co., Ltd., Yongin-si (KR)

(72) Inventor: Joo-Nyung Jang, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 91 days.

(21) Appl. No.: 16/817,743

(22) Filed: Mar. 13, 2020

(65) Prior Publication Data
US 2020/0312940 A1 Oct. 1, 2020

(30) Foreign Application Priority Data

Mar. 25, 2019 (KR) .......................... 10-2019-0033820

(51) Int. Cl.
*H01L 27/32* (2006.01)

(52) U.S. Cl.
CPC ........ *H01L 27/3276* (2013.01); *H01L 27/323* (2013.01)

(58) Field of Classification Search
CPC ............................ H01L 27/3276; H01L 27/323
See application file for complete search history.

(56) References Cited

U.S. PATENT DOCUMENTS

| | | | |
|---|---|---|---|
| 6,041,495 A * | 3/2000 | Yoon | H05K 3/4007 29/841 |
| 2004/0086739 A1 | 5/2004 | Matsumura et al. | |
| 2009/0169916 A1 | 7/2009 | Lee et al. | |
| 2011/0248406 A1 * | 10/2011 | Wada | H01L 24/05 257/E21.477 |
| 2015/0103500 A1 * | 4/2015 | Bae | H05K 1/111 228/102 |
| 2017/0127512 A1 * | 5/2017 | Park | H01L 25/167 |
| 2017/0212624 A1 * | 7/2017 | Katsuta | G06F 3/0446 |
| 2018/0151644 A1 * | 5/2018 | Han | H01L 51/524 |
| 2019/0181212 A1 * | 6/2019 | Koh | H01L 27/3255 |

(Continued)

FOREIGN PATENT DOCUMENTS

| | | |
|---|---|---|
| JP | 4113767 | 7/2008 |
| KR | 10-0568572 | 4/2006 |
| KR | 10-2007-0033507 | 3/2007 |

(Continued)

*Primary Examiner* — Vongsavanh Sengdara
(74) *Attorney, Agent, or Firm* — H.C. Park & Associates, PLC

(57) ABSTRACT

A circuit board includes a board, first connection pads disposed on the board and arranged in a first direction, second connection pads disposed on the board and arranged in the first direction, the second connection pads spaced apart from the first connection pads in a second direction perpendicular to the first direction, and a driving chip disposed on the board between the first connection pads and the second connection pads. Each of the first connection pads includes a first conductive layer disposed on the board, a second conductive layer which entirely overlaps with the first conductive layer in a plan view, is disposed on the first conductive layer and is formed of a different material from that of the first conductive layer, and a third conductive layer entirely overlapping with the second conductive layer and disposed on the second conductive layer.

12 Claims, 12 Drawing Sheets

(56) References Cited

U.S. PATENT DOCUMENTS

2020/0091270 A1    3/2020    Jang

FOREIGN PATENT DOCUMENTS

| KR | 10-2010-0073924 | 7/2010 |
| KR | 10-1054433 | 8/2011 |
| KR | 10-2017-0136421 | 12/2017 |
| KR | 10-2020-0032792 | 3/2020 |
| KR | 10-2020-0115756 | 10/2020 |

* cited by examiner

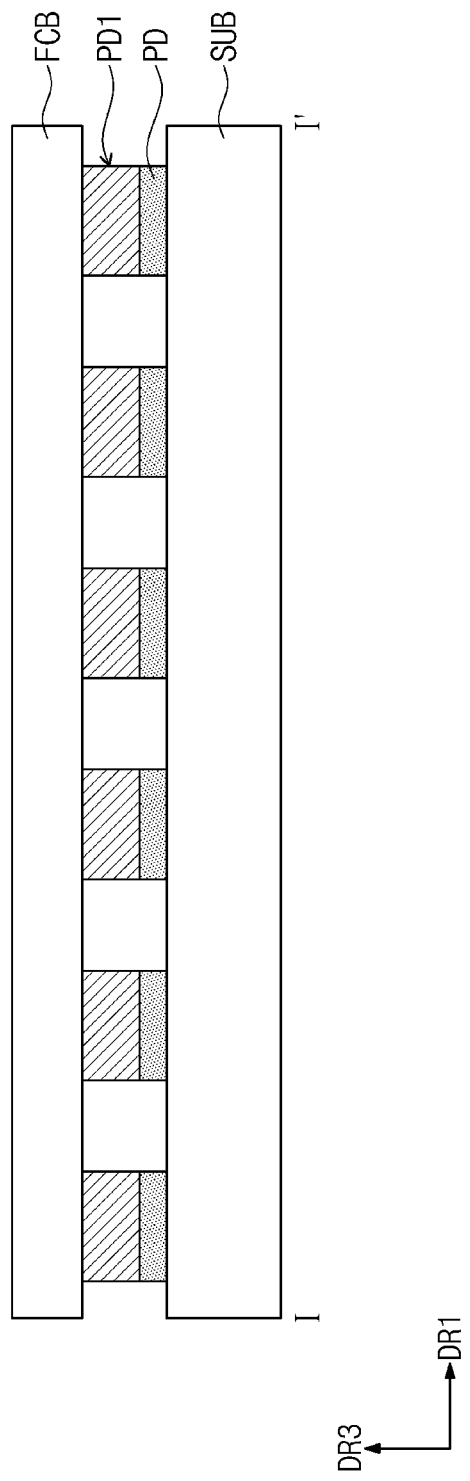

CIRCUIT BOARD AND DISPLAY DEVICE INCLUDING THE SAME

CROSS-REFERENCE TO RELATED APPLICATION

This application claims priority from and the benefit of Korean Patent Application No. 10-2019-0033820, filed on Mar. 25, 2019, which is hereby incorporated by reference for all purposes as if fully set forth herein.

BACKGROUND

Field

Exemplary embodiments relate to a display device, and more particularly, to a circuit board having flexibility and a display device including the same.

Discussion of the Background

Various display devices used in multimedia devices such as televisions, portable phones, tablet computers, navigation systems, and game consoles have been developed.

A display device may include a display panel for displaying an image. The display panel may include a plurality of gate lines, a plurality of data lines, and a plurality of pixels connected to the plurality of gate lines and the plurality of data lines. The display panel may be connected to a circuit board that provides electrical signals required for displaying an image to the gate lines or the data lines.

Meanwhile, the circuit board may be connected to the display panel by using an anisotropic conductive film or an ultrasonic bonding method. The method of connecting the display panel and the circuit board by the ultrasonic bonding method may increase conductivity and may simplify manufacturing processes, as compared with the method using the anisotropic conductive film.

The above information disclosed in this Background section is only for understanding of the background of the inventive concepts, and, therefore, it may contain information that does not constitute prior art.

SUMMARY

Devices and methods according to exemplary embodiments of the invention are capable of providing a circuit board bonded to a display panel by an ultrasonic bonding method, and a display device including the same.

Additional features of the inventive concepts will be set forth in the description which follows, and in part will be apparent from the description, or may be learned by practice of the inventive concepts.

In an embodiment of the inventive concepts, a circuit board includes a board, first connection pads disposed on the board and arranged in a first direction, second connection pads disposed on the board and arranged in the first direction, the second connection pads spaced apart from the first connection pads in a second direction perpendicular to the first direction, and a driving chip disposed on the board and disposed between the first connection pads and the second connection pads. Each of the first connection pads includes a first conductive layer disposed on the board, a second conductive layer which disposed on the first conductive layer and entirely overlaps with the first conductive layer in a plan view, the second conductive layer having a different material from that of the first conductive layer, and a third conductive layer disposed on the second conductive layer and entirely overlapping with the second conductive layer.

In an embodiment, a thickness of the first conductive layer in a thickness direction of the board may be greater than a thickness of the second conductive layer in the thickness direction, and the thickness of the second conductive layer may be greater than a thickness of the third conductive layer in the thickness direction.

In an embodiment, a planar area of the third conductive layer may be greater than a planar area of the second conductive layer, and the planar area of the second conductive layer may be greater than a planar area of the first conductive layer.

In an embodiment, a material of the first conductive layer and a material of the third conductive layer may be the same.

In an embodiment, the circuit board may further include first signal lines disposed between the driving chip and the first connection pads and electrically connecting the first connection pads to the driving chip, and second signal lines disposed between the driving chip and the second connection pads and electrically connecting the second connection pads to the driving chip.

In an embodiment, each of the first signal lines may include a first line layer disposed on the board and having a single unitary body with the first conductive layer, a second line layer disposed on the first line layer and having a single unitary body with the second conductive layer, and a third line layer disposed on the second line layer and having a single unitary body with the third conductive layer.

In an embodiment, a sum of thicknesses of the second and third line layers in a thickness direction of the board may be less than a thickness of the first line layer in the thickness direction.

In an embodiment, a material of the first conductive layer and a material of the first line layer may be the same, and a material of the second conductive layer and a material of the second line layer may be the same.

In an embodiment, each of the second connection pads may include a fourth conductive layer disposed on the board, a fifth conductive layer disposed on the fourth conductive layer and entirely overlaps with the fourth conductive layer, the fifth conductive layer having a different material from that of the fourth conductive layer, and a sixth conductive layer disposed on the fifth conductive layer and entirely overlapping with the fifth conductive layer.

In an embodiment, a material of the first conductive layer and a material of the fourth conductive layer may be the same, a material of the second conductive layer and a material of the fifth conductive layer may be the same, and a material of the third conductive layer and a material of the sixth conductive layer may be the same.

In an embodiment, a material of the fourth conductive layer and a material of the sixth conductive layer may be the same.

In an embodiment, a thickness of the fourth conductive layer in a thickness direction of the board may be greater than a sum of thicknesses of the fifth and sixth conductive layers in the thickness direction.

In an embodiment, each of the first to third conductive layers may include a metal.

In an embodiment, the third conductive layer may not be disposed on at least a portion of the second conductive layer.

In an embodiment of the inventive concepts, a display device includes a display module including a base substrate including a display area and a non-display area adjacent to the display area, and pads overlapping with the non-display area and disposed on the base substrate, and a circuit board including a board and connection pads disposed on the board and being in contact with the pads, respectively. Each of the connection pads includes a first conductive layer disposed on the board, a second conductive layer which overlaps with the first conductive layer, is disposed on the first conductive layer and has a different material from that of the first conductive layer, and a third conductive layer which overlaps with the second conductive layer, is disposed on the second conductive layer and is in contact with a corresponding one of the pads.

In an embodiment, the display device may further include a resin disposed between the base substrate and the board and surrounding the pads and the connection pads.

In an embodiment, at least a portion of the second conductive layer may be in contact with the corresponding pad.

In an embodiment, the second conductive layer may entirely overlap with the first conductive layer, and the third conductive layer may overlap with at least a portion of the second conductive layer.

In an embodiment, each of the pads may include a first driving conductive layer disposed on the base substrate, a second driving conductive layer disposed on the first driving conductive layer, and a third driving conductive layer disposed on the second driving conductive layer and being in contact with the third conductive layer.

In an embodiment, a material of the first driving conductive layer and a material of the third driving conductive layer may be the same, and a thickness of the second driving conductive layer may be greater than a thickness of each of the first and third driving conductive layers.

It is to be understood that both the foregoing general description and the following detailed description are exemplary and explanatory and are intended to provide further explanation of the invention as claimed.

BRIEF DESCRIPTION OF THE DRAWINGS

The accompanying drawings are included to provide a further understanding of the inventive concepts, and are incorporated in and constitute a part of this specification. The drawings illustrate exemplary embodiments of the inventive concepts and, together with the description, serve to explain principles of the inventive concepts.

FIG. 5A is a cross-sectional view taken along a line I-I' of FIG. 4A.

DETAILED DESCRIPTION OF THE EMBODIMENTS

Figure 1:
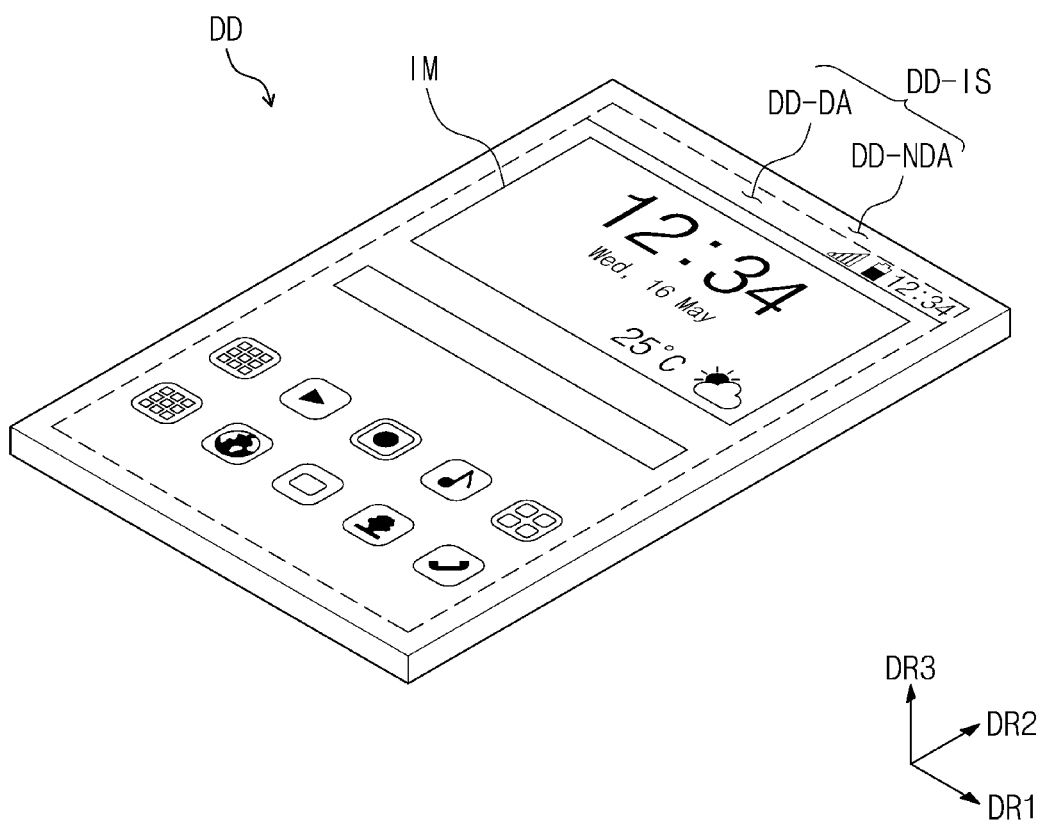
FIG. 1 is a perspective view illustrating a display device according to an embodiment of the inventive concepts.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As is customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, exemplary embodiments of the inventive concepts will be described in detail with reference to the accompanying drawings.

Figure 2:
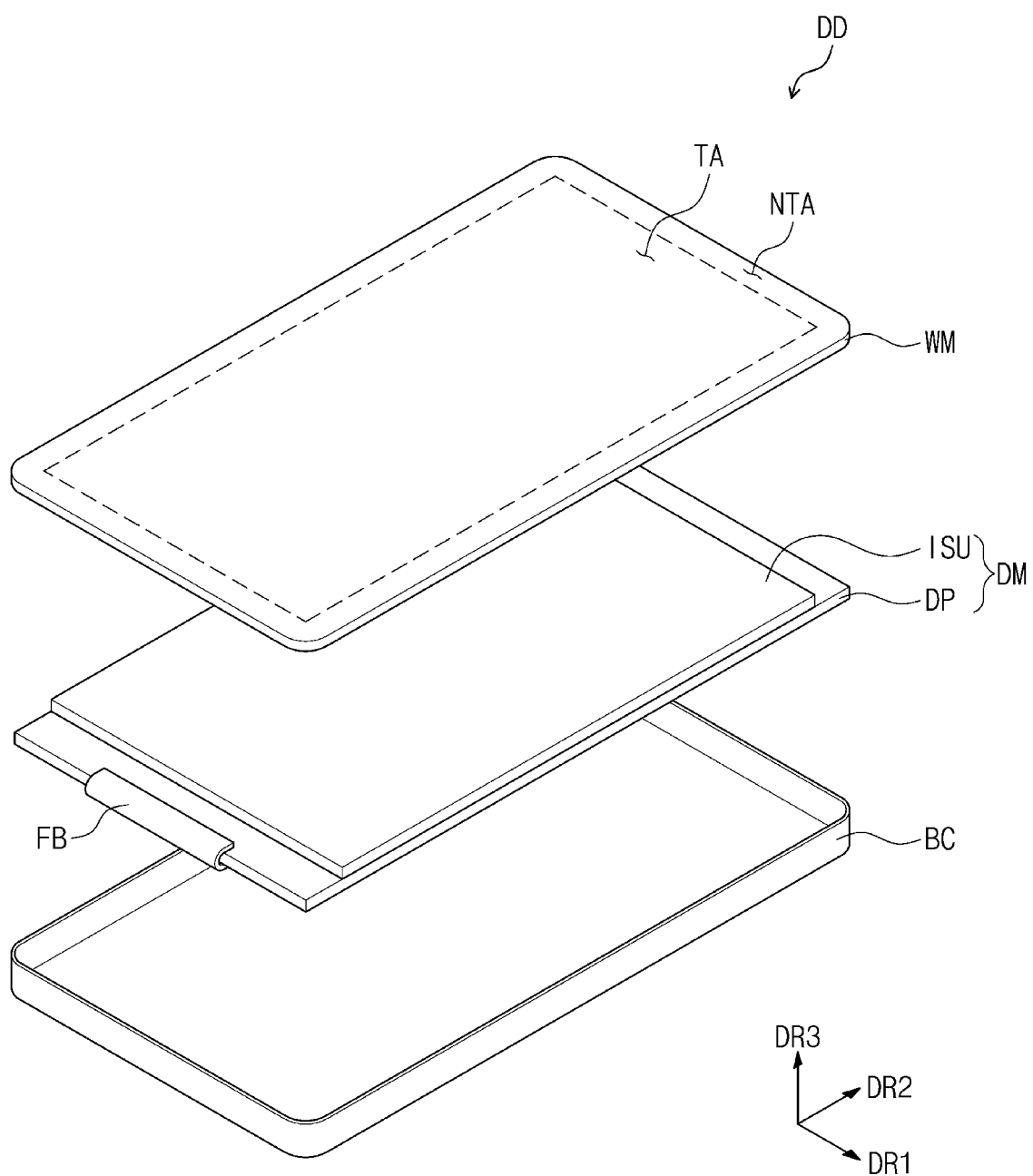
FIG. 2 is an exploded perspective view illustrating a display device according to an embodiment of the inventive concepts.

FIG. 1 is a perspective view illustrating a display device according to an embodiment of the inventive concepts. FIG. 2 is an exploded perspective view illustrating a display device according to an embodiment of the inventive concepts.

Referring to FIG. 1, a display device DD may display an image IM through a display surface DD-IS. In the present embodiment, the display device DD including a flat display surface DD-IS is illustrated. However, embodiments of the inventive concepts are not limited thereto. In other embodiments, the display device DD may include a curved display surface or a three-dimensional (3D) display surface. The 3D display surface may include a plurality of display areas extending in different directions from each other. For example, the 3D display surface may include a polygonal pillar-shaped display surface.

In an embodiment, the display device DD may be a flexible display device. However, embodiments of the inventive concepts are not limited thereto. In another embodiment, the display device DD may be a rigid display device.

Even though not shown in the drawings, electronic modules, a camera module and a power module, which are mounted on a main board, may be disposed together with the display device DD in a bracket and/or a case to constitute a mobile phone. The display device DD according to the inventive concepts may be applied to large-sized electronic devices (e.g., televisions and monitors) and small and middle-sized electronic devices (e.g., tablets, car navigation units, game consoles, and smart watches).

The display surface DD-IS may be parallel to a plane defined by a first direction DR1 and a second direction DR2. A normal direction of the display surface DD-IS (i.e., a thickness direction of the display device DD) may be indicated by a third direction DR3. In the present specification, it may be understood that when one or more components are viewed in a plan view, it or they may be viewed in a direction opposite to the third direction DR3. In addition, a planar area or size may mean an area or size when viewed in the direction opposite to the third direction DR3. A front surface (or a top surface) and a rear surface (or a bottom surface) of each of members or units described hereinafter may be defined by the third direction DR3. However, the first to third directions DR1, DR2 and DR3 in the present embodiment are illustrated as an example of the inventive concepts, and directions indicated by the first to third directions DR1, DR2 and DR3 may be changed into opposite directions.

As illustrated in FIG. 1, the display surface DD-IS may include a display area DD-DA in which the image IM is displayed, and a non-display area DD-NDA adjacent to the display area DD-DA. An image may not be displayed in the non-display area DD-NDA. In FIG. 1, application icons and a clock box are illustrated as an example of the image IM.

In the present embodiment, the display area DD-DA may have a rectangular shape, and the non-display area DD-NDA may have a shape surrounding the display area DD-DA in a plan view. However, embodiments of the inventive concepts are not limited thereto. The shapes of the display area DD-DA and the non-display area DD-NDA may be variously designed. For example, the non-display area DD-NDA may be disposed adjacent to only one side of the display area DD-DA or may be omitted.

Referring to FIG. 2, the display device DD may include a window WM, a display module DM, a circuit board FB, and a receiving member BC.

The window WM may be disposed on the display module DM and may transmit an image, provided from the display module DM, through a transmission area TA. The window WM may include the transmission area TA and a non-transmission area NTA. The transmission area TA may have a shape corresponding to that of the display area DD-DA illustrated in FIG. 1. In other words, the image IM displayed in the display area DD-DA of the display device DD may be visible to the outside through the transmission area TA of the window WM.

The non-transmission area NTA may have a shape corresponding to that of the non-display area DD-NDA illustrated in FIG. 1. A light transmittance of the non-transmission area NTA may be less than a light transmittance of the transmission area TA. However, embodiments of the inventive concepts are not limited thereto. In another embodiment, the non-transmission area NTA may be omitted.

For example, the window WM may be formed of glass, sapphire, or plastic. The window WM is illustrated as a single layer in FIG. 2. Alternatively, the window WM may include a plurality of layers. In an embodiment, the window WM may include a base layer and at least one printed layer disposed on a rear surface of the base layer. The printed layer may overlap with the non-transmission area NTA. The printed layer may have a predetermined color. For example, the printed layer may have a black color or may have another color different from the black color.

The display module DM may be disposed between the window WM and the receiving member BC. The display module DM may include a display panel DP and an input sensing unit ISU.

The display panel DP may generate an image and may provide the generated image to the window WM. According to some embodiments of the inventive concepts, the display panel DP may be, but not limited to, an organic light emitting display panel, a liquid crystal display panel, or a quantum-dot light emitting display panel. For example, the organic light emitting display panel may include organic light emitting elements. The liquid crystal display panel may include liquid crystal molecules. The quantum-dot light emitting display panel may include quantum dots or quantum rods.

The case in which the display panel DP is the organic light emitting display panel will be described hereinafter as an example. However, embodiments of the inventive concepts are not limited thereto. In other words, other various display panels may be applied to embodiments of the inventive concepts.

The input sensing unit ISU may be disposed between the window WM and the display panel DP. The input sensing unit ISU may sense an external input provided from the outside. The external input provided from the outside may be provided in various forms. For example, the external input may include at least one of various external inputs such as a part (e.g., a finger) of a user's body, a stylus pen, light, heat, and pressure. In addition, the external input may include an approaching spatial touch (e.g., a hovering touch) as well as the touch of the part of the user's body.

The input sensing unit ISU may be disposed directly on the display panel DP. In the present specification, it is understood that when a component 'A' is disposed directly on a component 'B', an adhesive layer is not disposed between the component 'A' and the component 'B'. In other words, the term 'directly' may mean that there are no intervening components. In the present embodiment, the input sensing unit ISU may be integrally formed with the display panel DP by continuous processes. However, embodiments of the inventive concepts are not limited thereto. In another embodiment, the input sensing unit ISU may be formed as an individual panel and then may be coupled to the display panel DP by an adhesive layer. In still another embodiment, the input sensing unit ISU may be omitted.

The circuit board FB may be connected to an end of the display panel DP to transmit driving signals to the display panel DP. In some embodiments, the circuit board FB may be a flexible printed circuit board, and the driving signals may be signals for displaying an image from the display panel DP. In addition, even though not shown in the drawings, a driving circuit board for providing the driving signals may be connected to an end of the circuit board FB. The circuit board FB may be disposed between the display panel DP and the driving circuit board and may transmit the driving signals provided from the driving circuit board to the display panel DP.

Meanwhile, the structure in which the circuit board FB is connected to the display panel DP is simply illustrated in FIG. 2. However, embodiments of the inventive concepts are not limited thereto. In another embodiment, the display device DD may further include a touch circuit board connected to the input sensing unit ISU. The touch circuit board may provide touch driving signals to the input sensing unit ISU. In an embodiment, a bonding method of connecting the circuit board FB and the display panel DP may be substantially the same as a bonding method of connecting the touch circuit board and the input sensing unit ISU.

The receiving member BC may be coupled to the window WM. The receiving member BC may provide a rear surface of the display device DD and may be coupled to the window WM to define an inner space. The receiving member BC may be formed of a material having relatively high rigidity. For example, the receiving member BC may include a plurality of frames and/or plates, which are formed of glass, plastic, and/or a metal. The receiving member BC may stably protect the components of the display device DD, which are received in the inner space, from an external impact.

In the above description, the receiving member BC may be formed of the material having the high rigidity. However, embodiments of the inventive concepts are not limited thereto. In another embodiment, the receiving member BC may be formed of a flexible material. Even though not shown in the drawings, the display device DD according to certain embodiments of the inventive concepts may be foldable or bendable. Thus, at least some components included in the display device DD may also have flexibility.

Figure 3:
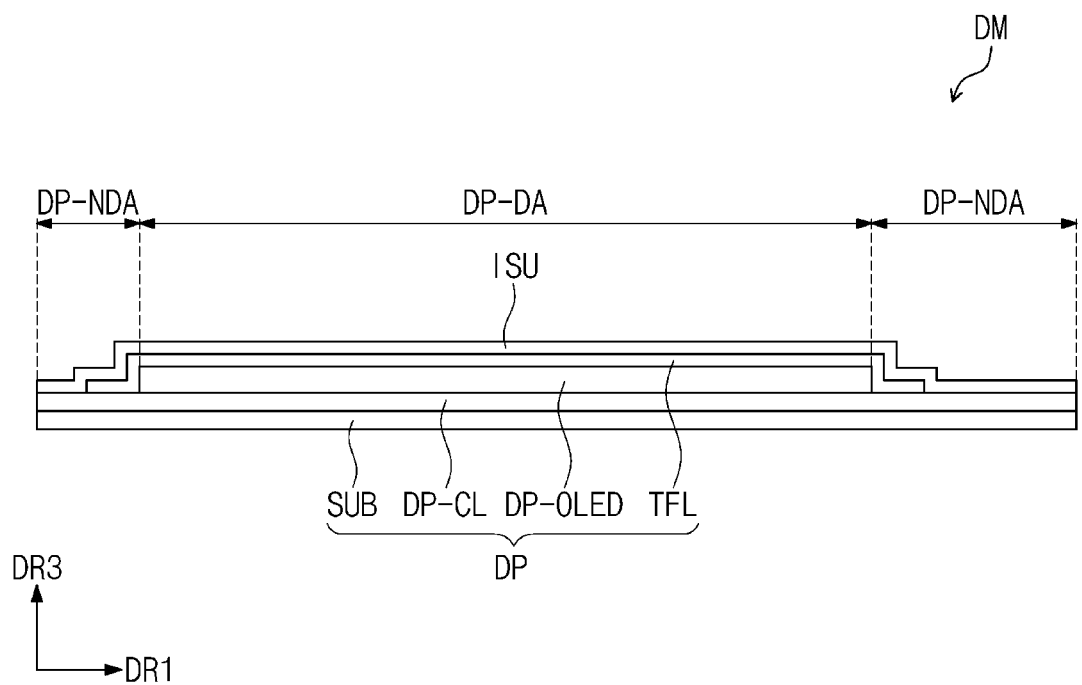
FIG. 3 is a cross-sectional view illustrating a display module according to an embodiment of the inventive concepts.

FIG. 3 is a cross-sectional view illustrating a display module DM according to an embodiment of the inventive concepts.

Referring to FIG. 3, the display panel DP of display module DM may include a base substrate SUB, a circuit element layer DP-CL, a display element layer DP-OLED, and an insulating layer TFL. The circuit element layer DP-CL, the display element layer DP-OLED and the insulating layer TFL may be disposed on the base substrate SUB.

The base substrate SUB may include at least one plastic film. The base substrate SUB may be a flexible substrate and may include a plastic substrate, a glass substrate, a metal substrate, or an organic/inorganic composite substrate. The display area DD-DA and the non-display area DD-NDA described with reference to FIG. 1 may correspond to a display area DP-DA and a non-display area DP-NDA defined in the base substrate SUB, respectively. The base substrate SUB may be referred to as a display substrate.

The circuit element layer DP-CL may include at least one intermediate insulating layer and a circuit element. The intermediate insulating layer may include at least one intermediate inorganic layer and at least one intermediate organic layer. The circuit element may include signal lines and a driving circuit of a pixel.

The display element layer DP-OLED may include a plurality of organic light emitting diodes. The display element layer DP-OLED may further include an organic layer such as a pixel defining layer. In another embodiment, when the display panel DP is the liquid crystal display panel, the display element layer may include a liquid crystal layer.

The insulating layer TFL may encapsulate the display element layer DP-OLED. For example, the insulating layer TFL may be a thin film encapsulation layer. The insulating layer TFL may protect the display element layer DP-OLED from foreign materials such as moisture, oxygen, and dust particles. In FIG. 3, the insulating layer TFL overlaps with the display area DP-DA and the non-display area DP-NDA. However, embodiments of the inventive concepts are not limited thereto. In another embodiment, the insulating layer TFL may not overlap with the non-display area DP-NDA. An input sensing unit ISU may be disposed on the insulating layer, but embodiments of the inventive concepts are not limited thereto.

Figure 4A:
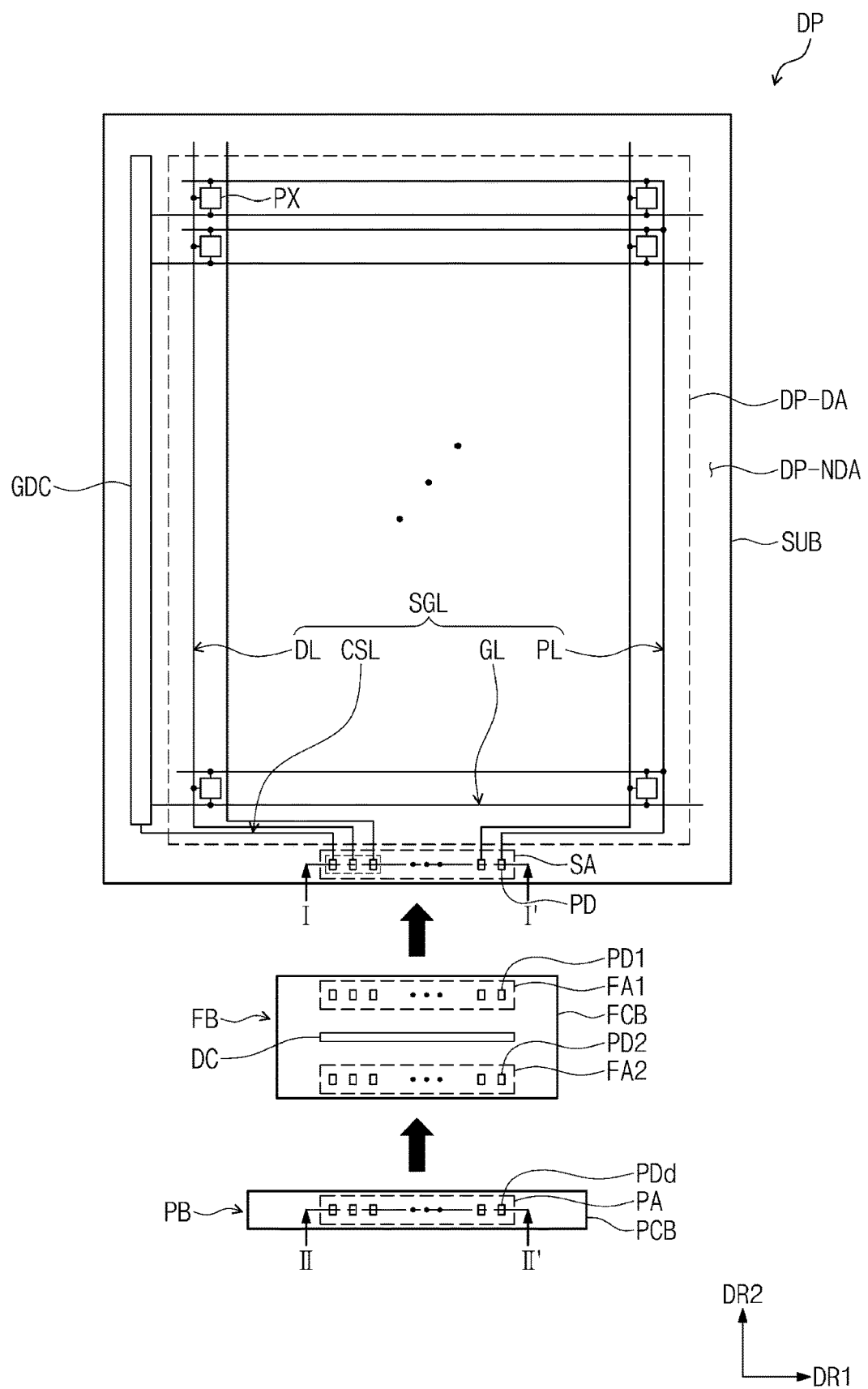
FIG. 4A is a plan view illustrating a display device according to an embodiment of the inventive concepts.
Figure 4B:
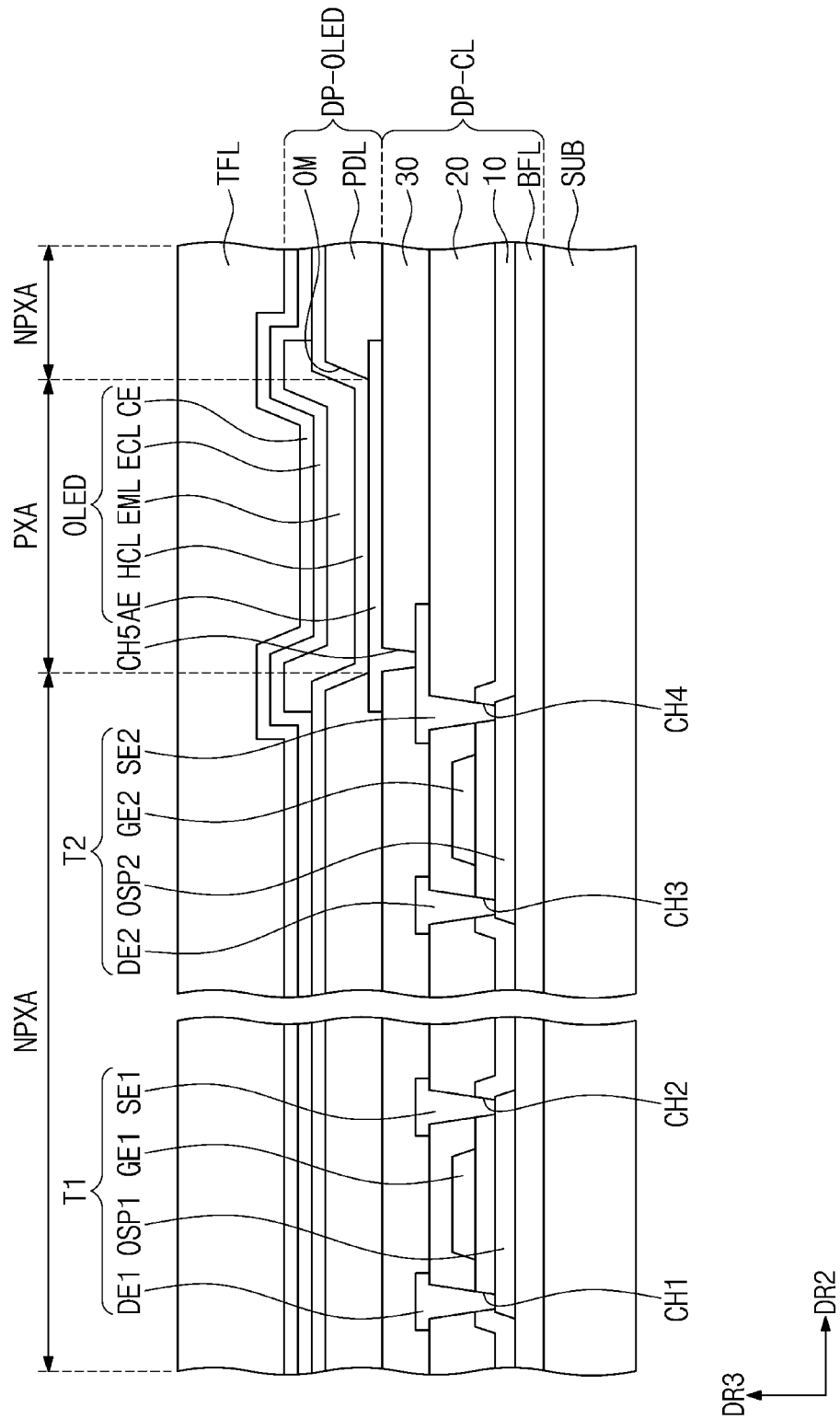
FIG. 4B is a cross-sectional view illustrating a portion of a display device according to an embodiment of the inventive concepts.

FIG. 4A is a plan view illustrating a display device according to an embodiment of the inventive concepts. FIG. 4B is a cross-sectional view illustrating a portion of a display device according to an embodiment of the inventive concepts.

Referring to FIG. 4A, the display device (e.g., display device DD) may include the display panel DP, the circuit board FB electrically connected to the display panel DP, and a driving circuit board PB electrically connected to the circuit board FB.

The display panel DP may include a gate driving circuit GDC, a plurality of signal lines SGL, a plurality of pads PD overlapping with a pad area SA, and a plurality of pixels PX.

The pixels PX may be disposed in the display area DP-DA. Each of the pixels PX may include an organic light emitting diode and a pixel driving circuit connected to the organic light emitting diode. The gate driving circuit GDC, the signal lines SGL, the pads PD and the pixel driving circuit may be included in the circuit element layer DP-CL disposed on the base substrate SUB illustrated in FIG. 3.

The gate driving circuit GDC may generate a plurality of gate signals and may sequentially output the gate signals to a plurality of gate lines GL to be described later. The gate driving circuit GDC may include a plurality of thin film transistors formed by the same process (e.g., a low-temperature polycrystalline silicon (LTPS) process or a low-temperature polycrystalline oxide (LTPO) process) as the pixel driving circuits of the pixels PX.

The signal lines SGL may overlap with the display area DP-DA and the non-display area DP-NDA and may be disposed on the base substrate SUB. The signal lines SGL may include gate lines GL, data lines DL, a power line PL, and a control signal line CSL. Each of the gate lines GL may be connected to corresponding ones of the pixels PX, and each of the data lines DL may be connected to corresponding ones of the pixels PX. The power line PL may be connected to the pixels PX. The control signal line CSL may provide control signals to the gate driving circuit GDC.

The circuit board FB may include a first board FCB, first connection pads PD1, second connection pads PD2, and a driving chip DC. The circuit board FB may be connected to an end of the display panel DP and an end of the driving circuit board PB. As described above, the circuit board FB may be a flexible printed circuit board. For example, as illustrated in FIG. 2, the circuit board FB may be bent along a side surface of the display panel DP, and thus a portion of the circuit board FB may be disposed on a rear surface of the display panel DP.

FIG. 4A illustrates a state in which the circuit board FB is separated from the display panel DP and the driving circuit board PB. However, the circuit board FB may be connected to a portion of the non-display area DP-NDA of the display panel DP and a portion of the driving circuit board PB.

A first pad area FA1 and a second pad area FA2 may be defined in the first board FCB. The first connection pads PD1 may be disposed in the first pad area FA1, and the second connection pads PD2 may be disposed in the second pad area FA2. The first connection pads PD1 may be spaced apart from each other in the first direction DR1, and the second connection pads PD2 may be spaced apart from each other in the first direction DR1.

When the circuit board FB is bonded to the display panel DP, the pad area SA and the first pad area FA1 may overlap with each other. In an embodiment, the first connection pads PD1 may be electrically bonded to the pads PD of the display panel DP, respectively. Thus, a plurality of driving signals transmitted from the first connection pads PD1 may be transmitted to the pixels PX of the display panel DP through the pads PD.

According to an embodiment of the inventive concepts, the pads PD of the display panel DP may be bonded to the first connection pads PD1 of the circuit board FB, respectively, on the basis of an ultrasonic bonding method. The ultrasonic bonding method may mean that two metal materials are bonded directly to each other by pressure and ultrasonic vibration. As a result, the pads PD may be in contact with the first connection pads PD1, respectively, and may be electrically connected to the first connection pads PD1, respectively.

The driving circuit board PB may include a second board PCB and driving pads PDd disposed on the second board PCB. The driving pads PDd may be disposed in a driving pad area PA defined in the second board PCB.

When the first board FCB of the circuit board FB is bonded to the second board PCB of the driving circuit board PB, the driving pad area PA and the second pad area FA2 may overlap with each other. In an embodiment, the second connection pads PD2 of the circuit board FB may be electrically bonded to the driving pads PDd of the driving circuit board PB, respectively. Thus, the driving signals outputted from the driving pads PDd of the driving circuit board PB may be transmitted to the second connection pads PD2 of the circuit board FB.

According to an embodiment of the inventive concepts, the second connection pads PD2 of the circuit board FB may be bonded to the driving pads PDd of the driving circuit board PB, respectively, on the basis of the ultrasonic bonding method. As a result, the driving pads PDd may be in contact with the second connection pads PD2, respectively, and may be electrically connected to the second connection pads PD2, respectively.

The driving chip DC may be disposed between the first connection pads PD1 and the second connection pads PD2. In other words, the first connection pads PD1 may be spaced apart from the second connection pads PD2 with the driving chip DC interposed therebetween.

The driving chip DC may receive the driving signals transmitted from the driving circuit board PB through the second connection pads PD2 and may output data signals, to be provided to the pixels PX, based on the received driving signals. The data signals may be transmitted to the pads PD through the first connection pads PD1. The pads PD may transmit the data signals transmitted from the driving chip DC to the data lines DL of the signal lines SGL, respectively.

In the present embodiment, the first connection pads PD1 and the second connection pads PD2 of the circuit board FB are bonded to other pads by the ultrasonic bonding method. However, embodiments of the inventive concepts are not limited thereto. In other embodiments, one group of the first connection pads PD1 and the second connection pads PD2 of the circuit board FB may be bonded to other pads by the ultrasonic bonding method, and the other group thereof may be bonded to still other pads by an adhesive material. For example, the adhesive material may be an anisotropic conductive film (ACF).

In addition, the circuit board FB may not overlap with the display element layer DP-OLED illustrated in FIG. 3 and may be disposed on the base substrate SUB.

Referring to FIG. 4B, the circuit element layer DP-CL may be disposed on the base substrate SUB.

The circuit element layer DP-CL may include at least one insulating layer and a circuit element. The circuit element may include a signal line and the pixel driving circuit of the pixel. The circuit element layer DP-CL may be formed through processes of forming the insulating layer, a semiconductor layer and a conductive layer using coating and/or deposition processes and processes of patterning the insulating layer, the semiconductor layer and the conductive layer using photolithography processes.

The circuit element layer DP-CL may include a buffer layer BFL corresponding to an inorganic layer, a first intermediate inorganic layer 10, a second intermediate inorganic layer 20, and an intermediate organic layer 30. In an embodiment, the buffer layer BFL may include a plurality of stacked inorganic layers.

In an embodiment, the pixel driving circuit may include at least two transistors T1 and T2 for driving an organic light emitting diode OLED of the display element layer DP-OLED. In FIG. 4B, a switching transistor T1 and a driving transistor T2 are illustrated as an example. The switching transistor T1 may be connected to the gate line GL and the data line DL (see FIG. 4A) and may control an operation of the driving transistor T2. The driving transistor T2 may be connected to the organic light emitting diode OLED of the display element layer DP-OLED and may control an operation of the organic light emitting diode OLED.

The switching transistor T1 may include a first semiconductor pattern OSP1, a first control electrode GE1, a first input electrode DE1, and a first output electrode SE1, and the driving transistor T2 may include a second semiconductor pattern OSP2, a second control electrode GE2, a second input electrode DE2, and a second output electrode SE2.

First and second through-holes CH1 and CH2 may be defined in the circuit element layer DP-CL to connect the first input electrode DE1 and the first output electrode SE1 of the switching transistor T1 to the first semiconductor pattern OSP1 of the switching transistor T1. Third and fourth through-holes CH3 and CH4 may be defined in the circuit element layer DP-CL to connect the second input electrode DE2 and the second output electrode SE2 of the driving transistor T2 to the second semiconductor pattern OSP2 of the driving transistor T2.

The display element layer DP-OLED may include the organic light emitting diode OLED. The display element layer DP-OLED may include a pixel defining layer PDL. For example, the pixel defining layer PDL may be an organic layer.

A first electrode AE may be disposed on the intermediate organic layer 30. The first electrode AE may be connected to the second output electrode SE2 through a fifth through-hole CH5 penetrating the intermediate organic layer 30. An opening OM may be defined in the pixel defining layer PDL. The opening OM of the pixel defining layer PDL may expose at least a portion of the first electrode AE. The opening OM of the pixel defining layer PDL may be referred to as an emission opening to distinguish it from other openings.

Even though not shown in the drawings, a spacer overlapping with a portion of the pixel defining layer PDL may be disposed on a top surface of the pixel defining layer PDL. The spacer and the pixel defining layer PDL may constitute a single unitary body, or the spacer may be an insulating structure formed by an additional process.

The display panel DP may include a light emitting area PXA and a non-light emitting area NPXA adjacent to the light emitting area PXA. The non-light emitting area NPXA may surround the light emitting area PXA. In the present embodiment, the light emitting area PXA is defined to correspond to a portion of the first electrode AE, which is exposed through the emission opening OM.

A hole control layer HCL may be disposed in common in the light emitting area PXA and the non-light emitting area NPXA. The hole control layer HCL may include a hole transfer layer and may further include a hole injection layer. An emission layer EML may be disposed on the hole control layer HCL. The emission layer EML may be disposed in an area corresponding to the emission opening OM. In other words, the emission layers EML of the pixels may be separated from each other. The emission layer EML may include an organic material and/or an inorganic material. The emission layer EML may generate light having a predetermined color.

An electron control layer ECL may be disposed on the emission layer EML. The electron control layer ECL may include an electron transfer layer and may further include an electron injection layer. The hole control layer HCL and the electron control layer ECL may be formed in common in the plurality of pixels PX by using an open mask. A second electrode CE may be disposed on the electron control layer ECL. The second electrode CE may have a single unitary body shape and may be disposed in common on the electron control layer ECL in the plurality of pixels PX.

The insulating layer TFL may be disposed on the second electrode CE. The insulating layer TFL may be a single encapsulation layer or may include a plurality of thin films.

Figure 5B:
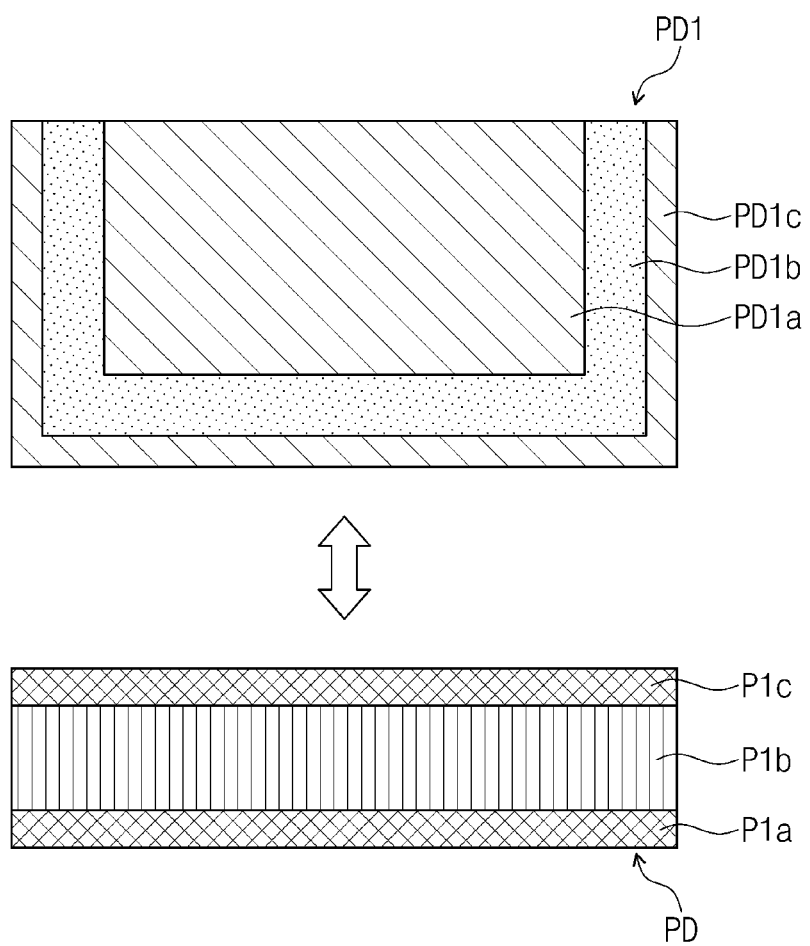
FIG. 5B is a cross-sectional view illustrating a pad and a first connection pad according to an embodiment of the inventive concepts.

FIG. 5A is a cross-sectional view taken along a line I-I' of FIG. 4A. FIG. 5B is a cross-sectional view illustrating a pad and a first connection pad according to an embodiment of the inventive concepts.

The bonding method between the pads PD disposed on the base substrate SUB of the display panel DP of FIG. 4A and the first connection pads PD1 disposed on the first board FCB of the circuit board FB of FIG. 4A will be described hereinafter with reference to FIGS. 5A and 5B. In FIG. 5A, six first connection pads PD1 are illustrated. However, the number of the first connection pads PD1 is not limited thereto. In certain embodiments, the number of the first connection pads PD1 may be at least one or more.

Referring to FIG. 5A, the base substrate SUB may face the first board FCB in the third direction DR3. The pads PD may face the first connection pads PD1 in the third direction DR3 and may be in contact with the first connection pads PD1. In particular, the pad PD and the first connection pad PD1 may be bonded to each other by the ultrasonic bonding method, as described above.

Referring to FIG. 5B, the pad PD may include a first driving conductive layer P1a, a second driving conductive layer P1b, and a third driving conductive layer P1c. The first driving conductive layer P1a may be disposed on the base substrate SUB. In particular, the first driving conductive layer P1a may be disposed directly on the base substrate SUB. The second driving conductive layer P1b may be disposed on the first driving conductive layer P1a, and the third driving conductive layer P1c may be disposed on the second driving conductive layer P1b.

According to an embodiment of the inventive concepts, a material of the first driving conductive layer P1a and a material of the third driving conductive layer P1c may be the same. For example, each of the first and third driving conductive layers P1a and P1c may be formed of titanium (Ti), and the second driving conductive layer P1b may be formed of aluminum (Al).

The first driving conductive layer P1a formed of titanium may be easily bonded to the base substrate SUB of a glass substrate and the second driving conductive layer P1b formed of aluminum by the ultrasonic bonding method. In addition, the third driving conductive layer P1c formed of titanium may be easily bonded to the second driving conductive layer P1b formed of aluminum by the ultrasonic bonding method.

A thickness of the second driving conductive layer P1b in the third direction DR3 may be greater than a thickness of each of the first and third driving conductive layers P1a and P1c in the third direction DR3.

The first connection pad PD1 may include a first conductive layer PD1a, a second conductive layer PD1b, and a third conductive layer PD1c. The first conductive layer PD1a may be disposed on the first board FCB of the circuit board FB. The second conductive layer PD1b may entirely overlap with the first conductive layer PD1a and may be disposed on the first conductive layer PD1a. The third conductive layer PD1c may entirely overlap with the second conductive layer PD1b and may be disposed on the second conductive layer PD1b.

According to an embodiment of the inventive concepts, a material of the first conductive layer PD1a and a material of the third conductive layer PD1c may be the same. For example, each of the first and third conductive layers PD1a and PD1c may be formed of copper (Cu), and the second conductive layer PD1b may be formed of tin (Sn). However, the materials of the first to third conductive layers PD1a, PD1b, and PD according to the inventive concepts are not limited thereto. In certain embodiments, each of the first to third conductive layers PD1a, PD1b, and PD1c may include one of other metal materials.

According to an embodiment of the inventive concepts, a thickness of the first conductive layer PD1a in the third direction DR3 may be greater than a thickness of the second conductive layer PD1b in the third direction DR3, and the thickness of the second conductive layer PD1b in the third direction DR3 may be greater than a thickness of the third conductive layer PD1c in the third direction DR3. In addition, a planar area of the third conductive layer PD1c may be greater than a planar area of the second conductive layer PD1b, and the planar area of the second conductive layer PD1b may be greater than a planar area of the first conductive layer PD1a.

In an embodiment, the first conductive layer PD1a may be disposed directly on the first board FCB and may transmit an electrical signal to a signal line disposed on the first board FCB. The second conductive layer PD1b may entirely cover the first conductive layer PD1a. Since the second conductive layer PD1b entirely covers the first conductive layer PD1a, oxidation reaction of the first conductive layer PD1a with the outside may be inhibited or prevented.

The third conductive layer PD1c may entirely cover the second conductive layer PD1b. In this case, the third conductive layer PD1c may be formed on the second conductive layer PD1b by a coating method. The third conductive layer PD1c may be a layer that is bonded to the third driving conductive layer P1c of the base substrate SUB by the ultrasonic bonding method.

For example, bonding efficiency of ultrasonic bonding between titanium (Ti) and copper (Cu) may be greater than that of ultrasonic bonding between titanium (Ti) and tin (Sn). Here, the bonding efficiency may mean that a contact area between two components is great. Typically, it may not be easy to bond the second conductive layer PD1b formed of tin (Sn) to the third driving conductive layer P1c formed of titanium (Ti) by the ultrasonic bonding method.

According to the embodiment of the inventive concepts, the third driving conductive layer P1c formed of titanium may be bonded to the third conductive layer PD1c formed of copper by the ultrasonic bonding method. Meanwhile, the third conductive layer PD1c may have a thickness necessary for the ultrasonic bonding with the third driving conductive layer P1c, and the thickness of the third conductive layer PD1c may be less than the thickness of each of the first and second conductive layers PD1a and PD1b. In addition, even though not shown in the drawings, when the third driving conductive layer P1c and the third conductive layer PD1c are adhered or bonded to each other by the ultrasonic bonding method, at least a portion of the second driving conductive layer P1b may be adhered or bonded to the third conductive layer PD1c and/or at least a portion of the second conductive layer PD1b may be adhered or bonded to the third driving conductive layer P1c and/or the second driving conductive layer P1b.

The third conductive layer PD1c of the first connection pad PD1 may be easily bonded to the third driving conductive layer P1c of the pad PD by the ultrasonic bonding method as described above, and thus process efficiency may be improved.

Figure 6A:
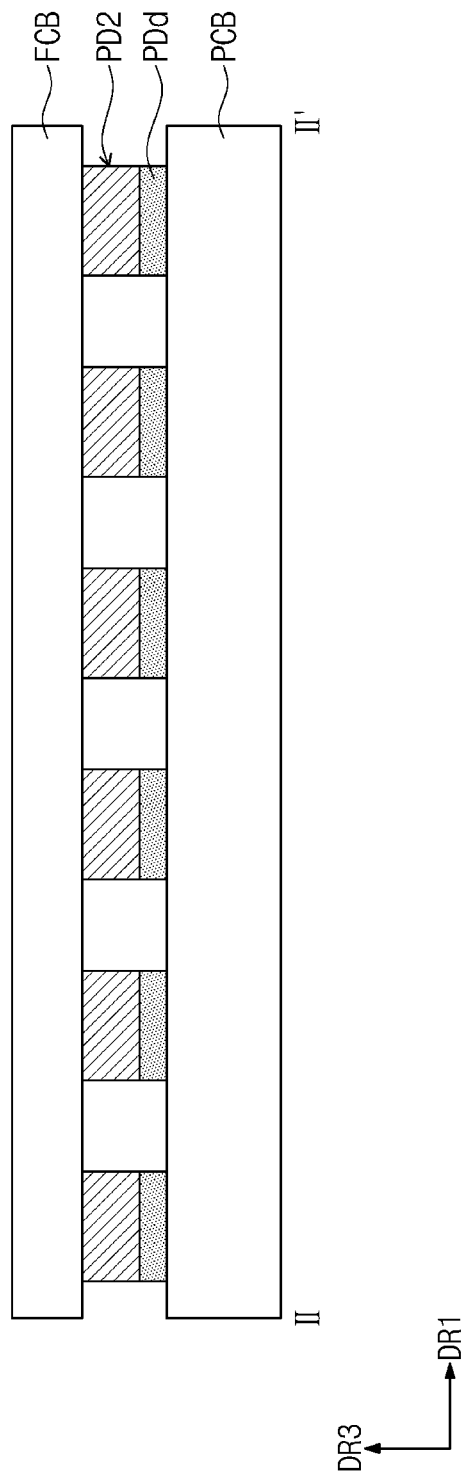
FIG. 6A is a cross-sectional view taken along a line II-II' of FIG. 4A.
Figure 6B:
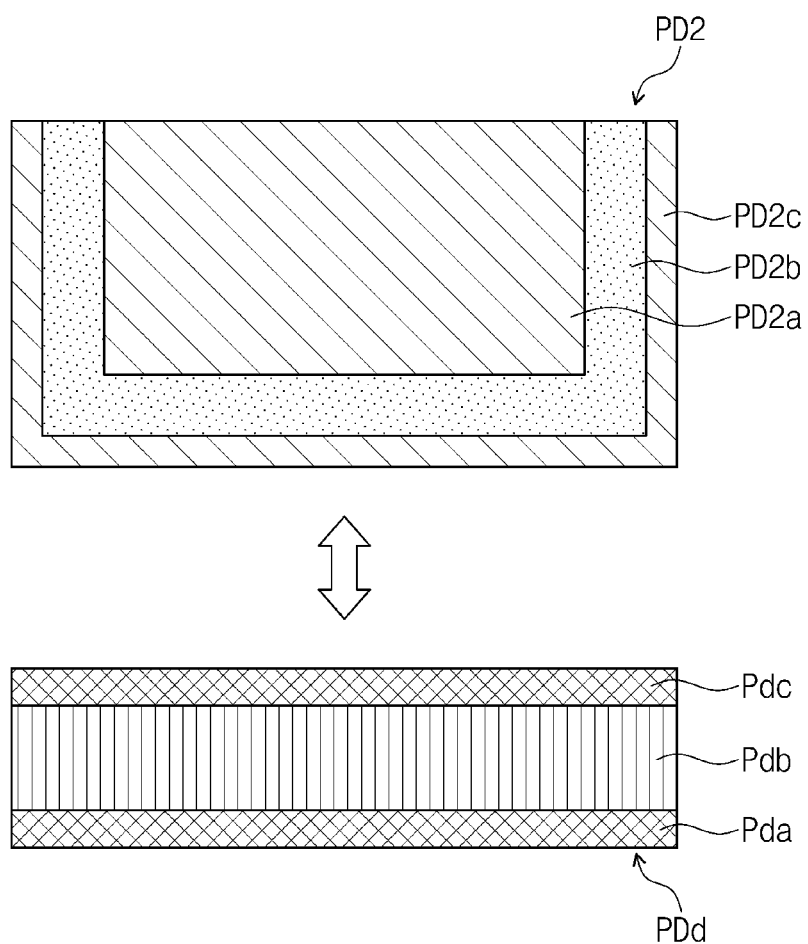
FIG. 6B is a cross-sectional view illustrating a second connection pad and a driving pad according to an embodiment of the inventive concepts.

FIG. 6A is a cross-sectional view taken along a line II-II' of FIG. 4A. FIG. 6B is a cross-sectional view illustrating a second connection pad and a driving pad according to an embodiment of the inventive concepts.

The bonding method between the driving pads PDd disposed on the second board PCB of the driving circuit board PB of FIG. 4A and the second connection pads PD2 disposed on the first board FCB of the circuit board FB of FIG. 4A will be described hereinafter with reference to FIGS. 6A and 6B.

Structures of the driving pad PDd and the second connection pad PD2 of FIGS. 6A and 6B may be substantially the same as those of the pad PD and the first connection pad PD1 of FIGS. 5A and 5B. Thus, the driving pad PDd and the second connection pad PD2 of FIGS. 6A and 6B will be described briefly, and the descriptions to the same features as in FIGS. 5A and 5B will be omitted.

The driving pad PDd may include a first driving conductive layer Pda, a second driving conductive layer Pdb, and a third driving conductive layer Pdc. The first driving conductive layer Pda may be disposed on the second board PCB. The second driving conductive layer Pdb may be disposed on the first driving conductive layer Pda, and the third driving conductive layer Pdc may be disposed on the second driving conductive layer Pdb.

According to an embodiment of the inventive concepts, a material of the first driving conductive layer Pda and a material of the third driving conductive layer Pdc may be the same. For example, each of the first and third driving conductive layers Pda and Pdc may be formed of titanium (Ti), and the second driving conductive layer Pdb may be formed of aluminum (Al).

The second connection pad PD2 may include a fourth conductive layer PD2a, a fifth conductive layer PD2b, and a sixth conductive layer PD2c. As described above, a material of the fourth conductive layer PD2a and a material of the sixth conductive layer PD2c may be the same, for example, copper (Cu). The fifth conductive layer PD2b may be formed of tin (Sn) for preventing oxidation reaction of the fourth conductive layer PD2a with the outside. A thickness of the fourth conductive layer PD2a may be greater than a sum of thicknesses of the fifth conductive layer PD2b and the sixth conductive layer PD2c, and the thickness of the fifth conductive layer PD2b may be greater than the thickness of the sixth conductive layer PD2c.

In an embodiment, the fourth conductive layer PD2a may be disposed on the first board FCB of the circuit board FB and may be formed of the same material as the first conductive layer PD1a. For example, the fourth conductive layer PD2a and the first conductive layer PD1a may be formed on the first board FCB by the same process.

The fifth conductive layer PD2b may entirely overlap with the fourth conductive layer PD2a and may be disposed on the fourth conductive layer PD2a. The fifth conductive layer PD2b may be formed of the same material as the second conductive layer PD1b and may be formed together with the second conductive layer PD1b on the first board FCB by the same process.

The sixth conductive layer PD2c may entirely overlap with the fifth conductive layer PD2b and may be disposed on the fifth conductive layer PD2b. The sixth conductive layer PD2c may be formed of the same material as the third conductive layer PD1c and may be formed together with the third conductive layer PD1c on the first board FCB by the same process.

According to the embodiment of the inventive concepts, the third driving conductive layer Pdc formed of titanium (Ti) may be bonded to the sixth conductive layer PD2c formed of copper (Cu) by the ultrasonic bonding method.

Figure 7:
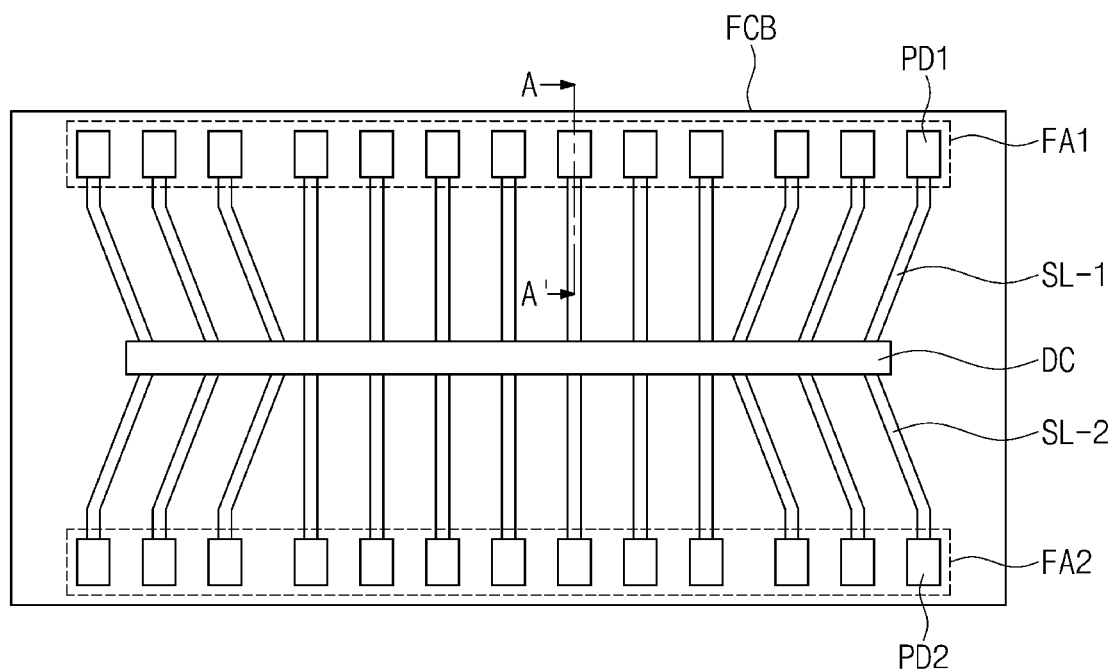
FIG. 7 is a plan view illustrating a circuit board of FIG. 4A.
Figure 8:
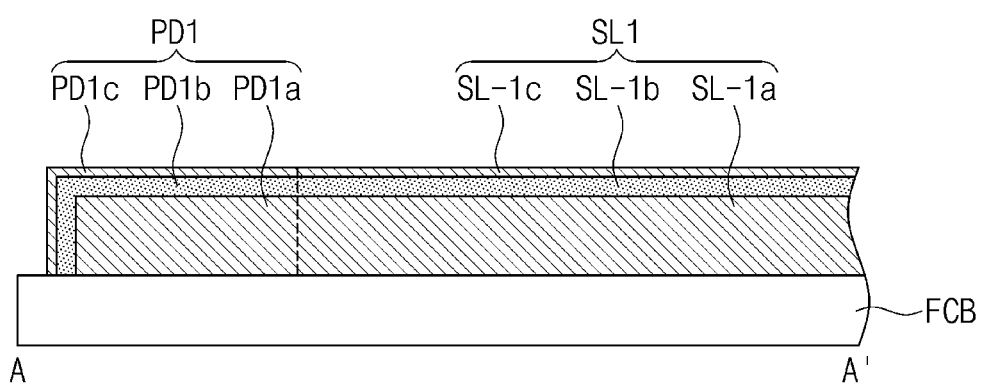
FIG. 8 is a cross-sectional view taken along a line A-A' of FIG. 7.

FIG. 7 is a plan view illustrating a circuit board of FIG. 4A. FIG. 8 is a cross-sectional view taken along a line A-A' of FIG. 7.

Referring to FIG. 7, the circuit board FB may further include first signal lines SL-1 and second signal lines SL-2 not shown in the circuit board FB of FIG. 4A.

The first signal lines SL-1 may be disposed between the driving chip DC and the first connection pads PD1 to electrically connect the first connection pads PD1 in first pad area FA1 to the driving chip DC. First ends of the first signal lines SL-1 may be connected to the first connection pads PD1, and second ends of the first signal lines SL-1 may be connected to the driving chip DC.

The second signal lines SL-2 may be disposed between the driving chip DC and the second connection pads PD2 in the second pad area FA2 to electrically connect the second connection pads PD2 to the driving chip DC. First ends of the second signal lines SL-2 may be connected to the second connection pads PD2, and second ends of the second signal lines SL-2 may be connected to the driving chip DC.

Referring to FIG. 8, each of the first signal lines SL-1 according to an embodiment may include first to third line layers SL-1a, SL-1b and SL-1c. The first line layer SL-1a may be formed by the same process as the first conductive layer PD1a and may be disposed on the first board FCB. For example, the first line layer SL-1a and the first conductive layer PD1a may constitute a single unitary body.

The second line layer SL-1b may be formed by the same process as the second conductive layer PD1b and may be disposed on the first line layer SL-1a. For example, the second line layer SL-1b and the second conductive layer PD1b may constitute a single unitary body.

The third line layer SL-1c may be formed by the same process as the third conductive layer PD1c and may be disposed on the second line layer SL-1b. For example, the third line layer SL-1c and the third conductive layer PD1c may constitute a single unitary body.

As illustrated in FIG. 8, a thickness of the first line layer SL-1a may be greater than a sum of thicknesses of the second line layer SL-1b and the third line layer SL-1c. In addition, a material of the first line layer SL-1a and a material of the third line layer SL-1c may be the same (e.g., copper (Cu)), and the second line layer SL-1b may be formed of tin (Sn).

Even though not shown in the drawings, the second signal lines SL-2 and the second connection pads PD2 may also have the structure illustrated in FIG. 8.

Figure 9:
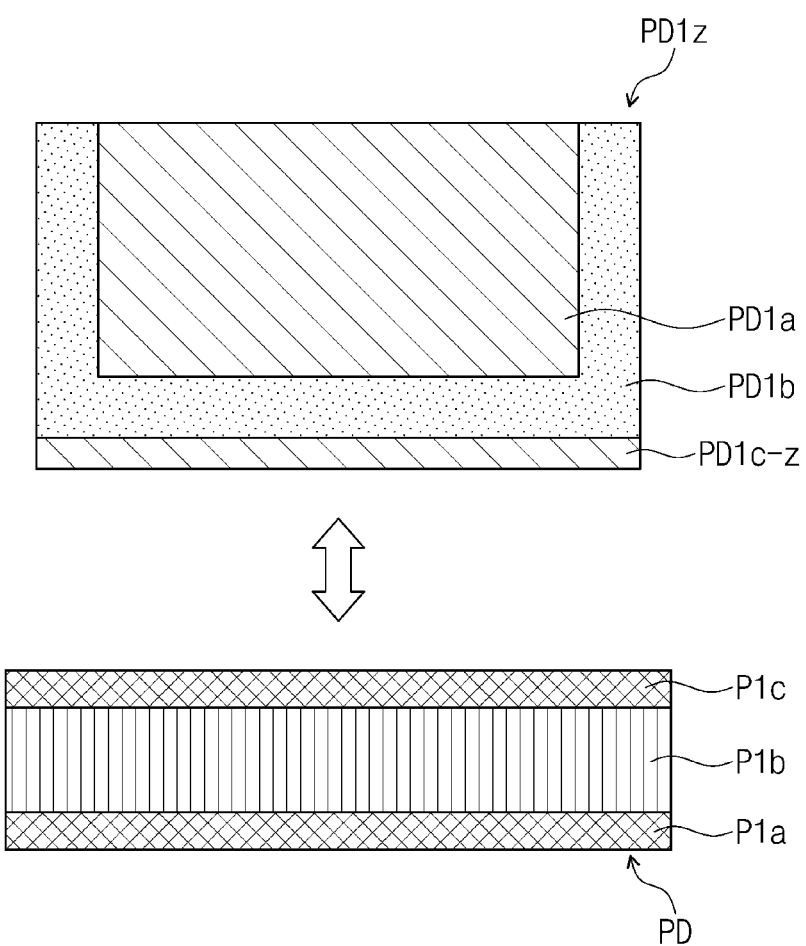
FIG. 9 is a cross-sectional view illustrating a pad and a first connection pad according to another embodiment of the inventive concepts.

FIG. 9 is a cross-sectional view illustrating a pad and a first connection pad according to another embodiment of the inventive concepts.

A structure of a third conductive layer PD1c-z of a first connection pad PD1z of FIG. 9 may be different from that of the third conductive layer PD of the first connection pad PD1 of FIG. 5B, and the other components of FIG. 9 may be substantially the same as corresponding components of FIG. 5B. Thus, the descriptions to the other components will be omitted.

Referring to FIG. 9, the third conductive layer PD1c-z may entirely overlap with the second conductive layer PD1b. In particular, the third conductive layer PD1c-z according to the inventive concepts may be disposed on only a top surface of the second conductive layer PD1b. In other words, the third conductive layer PD1c-z may not be disposed on a portion of the second conductive layer PD1b. For example, the third conductive layer PD1c-z may be formed on only the top surface of the second conductive layer PD1b which is ultrasonically bonded to the third driving conductive layer P1c but may not be formed on a side surface of the second conductive layer PD1b.

Figure 10:
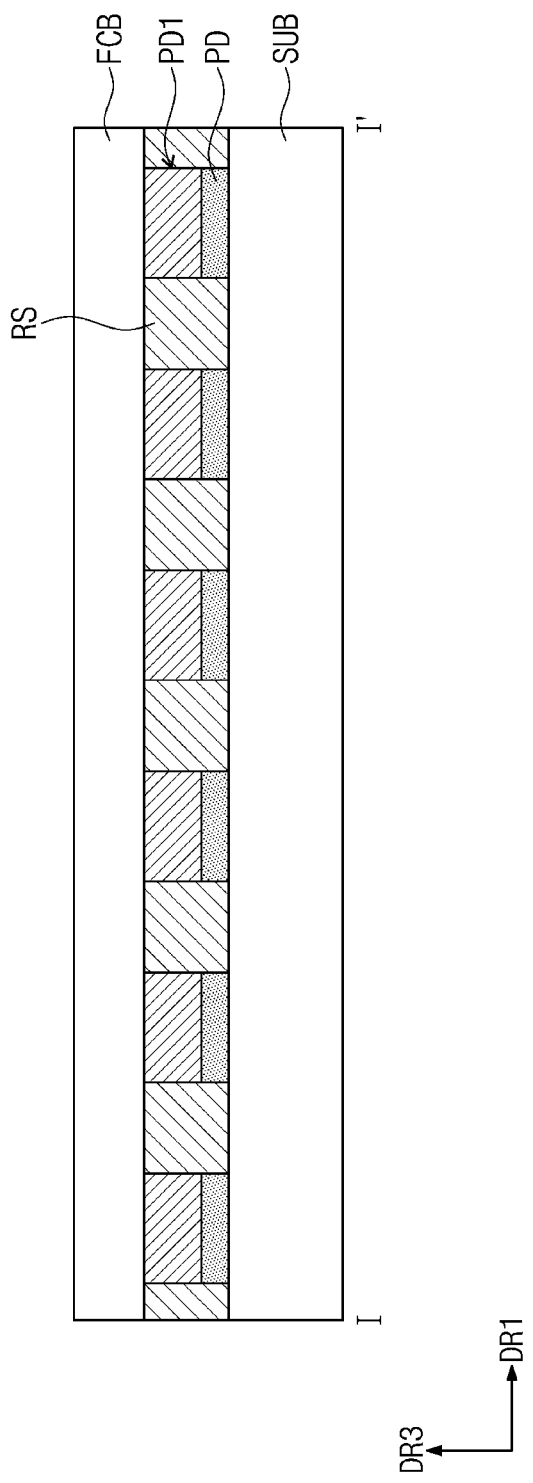
FIG. 10 is a cross-sectional view taken along the line I-I' of FIG. 4A to illustrate a display device according to another embodiment of the inventive concepts.

FIG. 10 is a cross-sectional view taken along the line I-I' of FIG. 4A to illustrate a display device according to another embodiment of the inventive concepts.

Referring to FIG. 10, a resin RS may be disposed between the first board FCB and the base substrate SUB. The resin RS may shield the pad PD and the first connection pad PD1 from external air. As a result, oxidation of the pad PD and the first connection pad PD1 may be prevented.

Even though not shown in the drawings, a resin may also be disposed between the first board FCB and the second board PCB. As a result, the driving pad PDd and the second connection pad PD2 of FIG. 6A may be shielded by the resin from external air.

According to the embodiments of the inventive concepts, the pad of the display panel may be bonded to the connection pad of the circuit board by the ultrasonic bonding method. Thus, it is possible to improve electrical connection characteristics between the pad of the display panel and the connection pad of the circuit board.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A flexible printed circuit board for a display panel, comprising:
    a board that is flexible;
    first connection pads disposed on the board and arranged in a first direction and configured for connection to the display panel;
    second connection pads disposed on the board and arranged in the first direction, the second connection pads spaced apart from the first connection pads in a second direction perpendicular to the first direction; and
    a driving chip disposed on the board between the first connection pads and the second connection pads and configured for driving the display panel;
    first signal lines disposed between the driving chip and the first connection pads and electrically connecting the first connection pads to the driving chip; and
    second signal lines disposed between the driving chip and the second connection pads and electrically connecting the second connection pads to the driving chip,
    wherein:
    each of the first connection pads comprises:
        a first conductive layer disposed directly on the board;
        a second conductive layer disposed on the first conductive layer and entirely overlapping with the first conductive layer in a plan view, the second conductive layer having a different material from that of the first conductive layer; and
        a third conductive layer disposed on the second conductive layer and entirely overlapping with the second conductive layer in the plan view;
    a thickness of the third conductive layer in a thickness direction of the board is less than each of a thickness of the first conductive layer and a thickness of the second conductive layer; and
    each of the first signal lines comprises:
        a first line layer disposed on the board and having a single unitary body with the first conductive layer;
        a second line layer disposed on the first line layer and having a single unitary body with the second conductive layer; and
        a third line layer disposed on the second line layer and having a single unitary body with the third conductive layer.

2. The circuit board of claim 1, wherein the thickness of the first conductive layer in the thickness direction of the board is greater than the thickness of the second conductive layer in the thickness direction.

3. The circuit board of claim 2, wherein a planar area of the third conductive layer is greater than a planar area of the second conductive layer, and the planar area of the second conductive layer is greater than a planar area of the first conductive layer.

4. The circuit board of claim 1, wherein a material of the first conductive layer and a material of the third conductive layer are the same.

5. The circuit board of claim 1, wherein a sum of thicknesses of the second and third line layers in the thickness direction of the board is less than a thickness of the first line layer in the thickness direction.

6. The circuit board of claim 1, wherein a material of the first conductive layer and a material of the first line layer are the same, and a material of the second conductive layer and a material of the second line layer are the same.

7. The circuit board of claim 1, wherein each of the second connection pads comprises:
    a fourth conductive layer disposed on the board;
    a fifth conductive layer disposed on the fourth conductive layer and entirely overlaps with the fourth conductive layer, the fifth conductive layer having a different material from that of the fourth conductive layer; and
    a sixth conductive layer disposed on the fifth conductive layer and entirely overlapping with the fifth conductive layer.

8. The circuit board of claim 7, wherein a material of the first conductive layer and a material of the fourth conductive layer are the same, a material of the second conductive layer and a material of the fifth conductive layer are the same, and a material of the third conductive layer and a material of the sixth conductive layer are the same.

9. The circuit board of claim 7, wherein a material of the fourth conductive layer and a material of the sixth conductive layer are the same.

10. The circuit board of claim 7, wherein a thickness of the fourth conductive layer in the thickness direction of the board is greater than a sum of thicknesses of the fifth and sixth conductive layers in the thickness direction.

11. The circuit board of claim 1, wherein each of the first to third conductive layers includes a metal.

12. The circuit board of claim 1, wherein the third conductive layer is not disposed on at least a portion of the second conductive layer.

\* \* \* \* \*